United States Patent [19]

Wang et al.

[11] Patent Number: 4,897,616

[45] Date of Patent: Jan. 30, 1990

[54] WIDE BAND AMPLIFIER WITH CURRENT MIRROR FEEDBACK TO BIAS CIRCUIT

[75] Inventors: Anthony D. Wang; R. Mark Stitt, II, both of Tucson, Ariz.

[73] Assignee: Burr-Brown Corporation, Tucson, Ariz.

[21] Appl. No.: 223,796

[22] Filed: Jul. 25, 1988

[51] Int. Cl.⁴ .............................................. H03F 3/30
[52] U.S. Cl. ..................................... 330/265; 330/267; 330/288; 330/290
[58] Field of Search ............... 330/265, 267, 270, 288, 330/290

[56] References Cited

U.S. PATENT DOCUMENTS

| | | | |
|---|---|---|---|
| 4,112,386 | 9/1978 | Everhart et al. | 330/265 |
| 4,227,157 | 10/1980 | Davies et al. | 330/265 |
| 4,291,276 | 9/1981 | Ida | 330/85 |
| 4,339,729 | 7/1982 | Jason et al. | 330/294 |
| 4,358,739 | 11/1982 | Nelson | 330/255 |
| 4,502,020 | 2/1985 | Nelson | 330/265 |
| 4,703,285 | 10/1987 | Woo | 330/260 |

FOREIGN PATENT DOCUMENTS 119908 7/1984 Japan ...................................... 330/265
0052010 3/1986 Japan .

Primary Examiner—James B. Mullins
Attorney, Agent, or Firm—Cahill, Sutton & Thomas

[57] ABSTRACT

A wideband integrated circuit amplifier includes a pair of current mirror circuits sensing emitter currents of NPN and PNP transistors in the amplifier output stage. A pair of current mirror circuits divide the emitter currents, respectively, by a factor of 20. The current mirror output currents are summed, current splitter directs approximately 1/20 of the summed mirror currents through a transistor, the collector of which is coupled to the gate electrode of a field effect input transistor of a bias control circuit, to produce a scaled down feedback current. A high impedance current source is connected to the collector of the transistor. The bias circuit adjusts the DC bias voltage applied between the base electrodes of the transistors to cause the scaled down feedback current to equal the constant current. A very small compensation capacitor produces a low frequency pole that prevents the bias circuit from interfering with high frequency performance characteristics of a wide band amplifier.

25 Claims, 2 Drawing Sheets

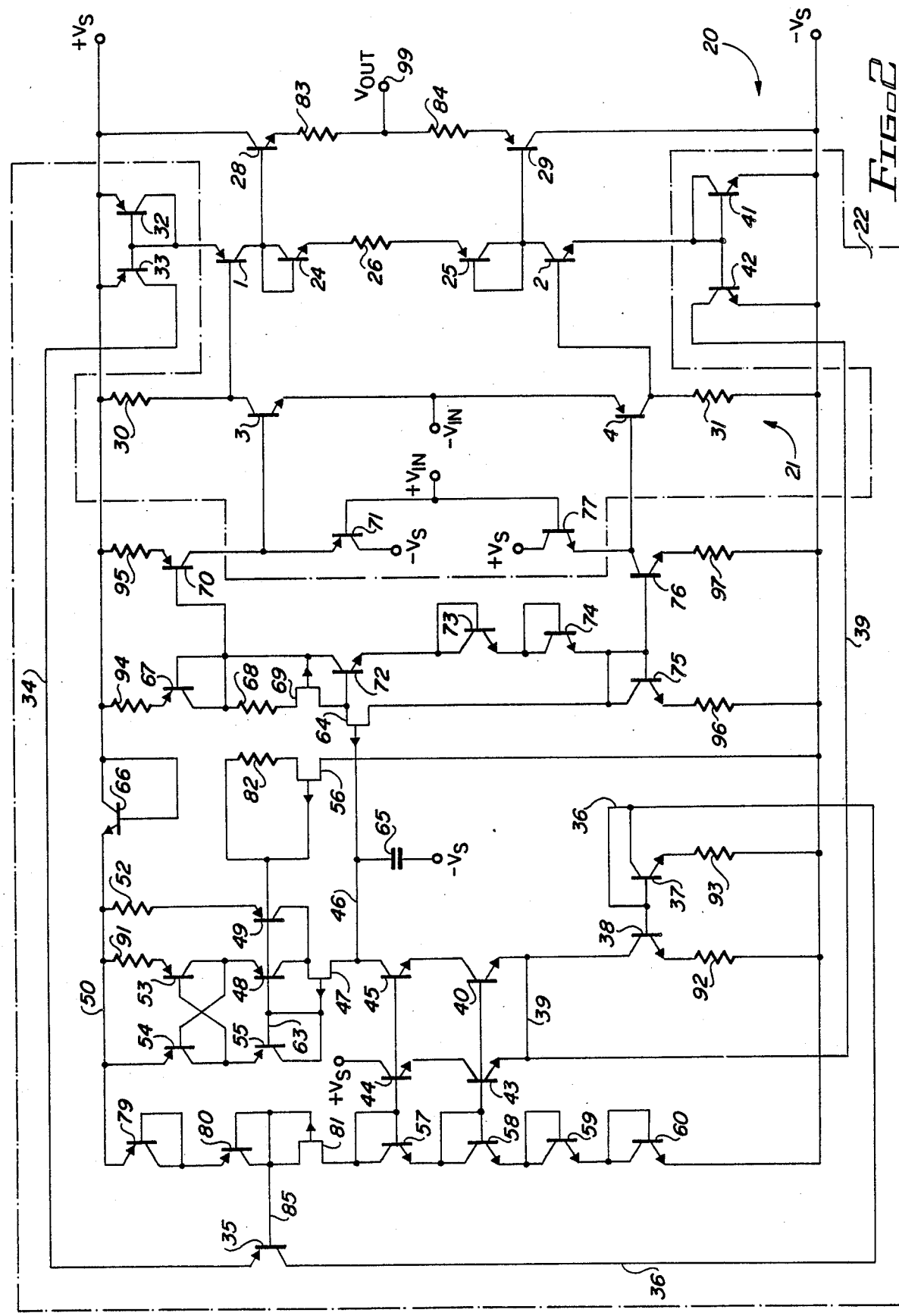

WIDE BAND AMPLIFIER WITH CURRENT MIRROR FEEDBACK TO BIAS CIRCUIT

BACKGROUND OF THE INVENTION

The invention relates to wideband amplifiers, and more particularly to bias control circuitry operable with a compensation capacitor small enough to be integrated into a monolithic integrated circuit.

Quite a number of wideband amplifier circuits, such as those disclosed in U.S. Pat. No. 4,358,739 (Nelson) and U.S. Pat. No. 4,502,020 (Nelson et al) are known. All of the prior art wideband amplifier circuits (and also the circuit of the present invention) require input bias circuits that sense the current flowing in the push-pull gain stage to generate feedback to the input bias circuitry. In response to the feedback, the bias circuitry generates bias voltages for the input stage to prevent drift resulting from changes in output stage power dissipation. The feedback correction prevents increases in currents in the output transistors as a result of temperature-caused decreases in the $V_{BE}$'s (base-to-emitter voltage) of the output transistors. Such decreased $V_{BE}$'s, if not compensated for, could cause "thermal runaway" of the output transistor currents, resulting in destroying the output transistors.

The bias feedback circuits of prior wideband amplifiers always have slow response to sensed changes in the current in output transistors of the push-pull output stage. The slow response ensures that the bias circuit does not interact with the high frequency performance of the input stage of the wideband amplifier. In all prior wideband amplifiers known to us, very large compensation capacitors having capacitances of at least about 0.01 microfarads have been required to produce the needed slow feedback response. Unfortunately, it is entirely impractical to provide such a large capacitor on a monolithic or hybrid integrated circuit. Consequently, additional package pins and large external capacitors have been required in the prior integrated circuit wideband amplifiers.

SUMMARY OF THE INVENTION

Accordingly, it is an object of the invention to provide an integrated wideband amplifier circuit having an internal bias circuit compensation capacitor.

It is anther object of the invention to provide an integrated wideband amplifier circuit that reliably operates with an internal bias circuit compensation capacitor in its input bias feedback circuit.

Briefly described, and in accordance with one embodiment thereof, the invention provides an input bias feedback circuit in an amplifier that is operable with a sufficiently low compensation capacitance that a compensation capacitor can be included on an integrated circuit chip with the amplifier. In one embodiment of the invention, a first current mirror circuit is used to sense an emitter current of a first transistor in an output stage of the amplifier. A feedback current which is a certain percentage of the mirrored current is caused to flow through a second transistor having a very high output impedance. A reference current is supplied by a high impedance current source, and the feedback current is compared with the reference current to produce an error signal. The error signal is applied to a high impedance input terminal of a DC bias circuit which controls a DC bias voltage applied to an output stage of the amplifier to cause the feedback current to equal the reference current. The error signal is compensated by the compensation capacitor. In the described embodiment of the invention, an emitter current in a second transistor of the output stage is sensed by means of a second current mirror circuit to produce a second mirrored current. An inverted replica of the first mirrored current is summed with the second mirrored current to produce a feedback current which is a certain fraction of the summed mirrored currents. The feedback current flows through a transistor having a high output impedance and is summed with a reference current from the high impedance current source.

In the described embodiment of the invention, the amplifier is a wide band amplifier, the first and second transistors include a PNP transistor and a NPN transistor, the first current mirror circuit is a PNP current mirror, a control transistor of which is coupled in series with the emitter of the PNP transistor, and the second current mirror circuit is an NPN current mirror a control transistor of which is connected in series with the emitter of the NPN transistor. The first feedback current is fed to a control transistor of another NPN current mirror, an output of which is connected to the output of the second current mirror circuit to effectuate the summing. A current splitter produces the feedback current, which is fed into the emitter of an NPN transistor, the collector of which is coupled to the constant current source. The constant current source includes a circuit which generates the reference current. The compensation capacitor provides good isolation of the wideband amplifier from variations in the feedback currents at high frequencies.

BRIEF DESCRIPTION OF THE DRAWINGS

FIG. 2 is a schematic diagram of the wideband amplifier of the present invention.

DETAILED DESCRIPTION OF THE PREFERRED EMBODIMENT OF THE INVENTION

Figure 1:
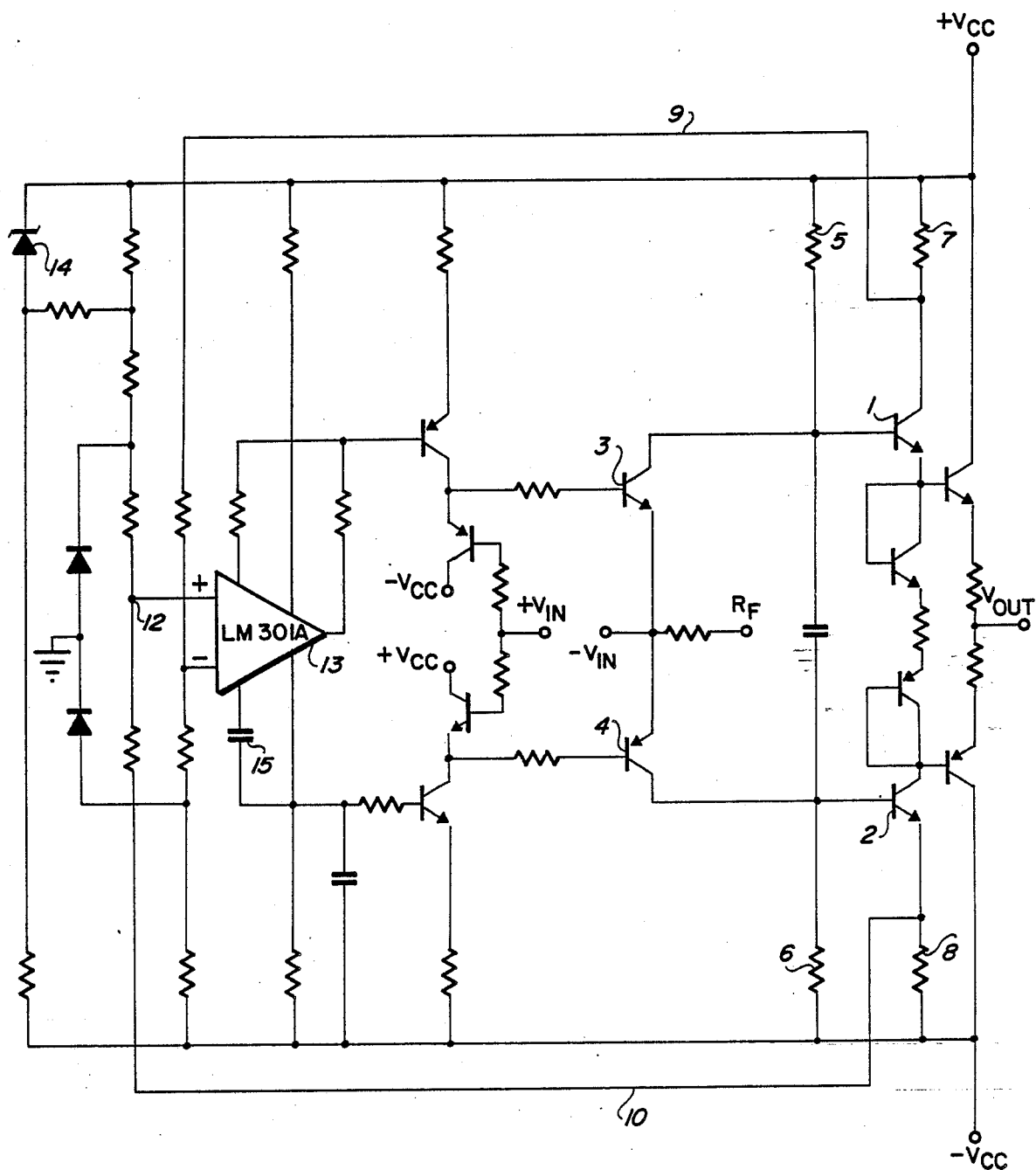
FIG. 1 is a schematic diagram of a prior art circuit and is useful for comparison with the present invention.

Before describing the presently preferred embodiment of FIG. 2, it would be helpful to briefly describe the prior art circuit of FIG. 1 to better understand the distinguishing features of the present invention. FIG. 1 shows a circuit of the COMLINEAR CLC300A wideband amplifier. Its push-pull output stage includes PNP transistor 1 and NPN transistor 2, the collector electrodes of which are coupled by two diodes and a resistor. Transistors 3 and 4 and resistors 5 and 6 maintain bias voltages on the base electrodes of transistors 1 and 2. To adjust the bias voltages on the inputs of the NPN/PNP push-pull output driver circuit producing the output voltage $V_{OUT}$, Resistors 7 and 8 connect the emitters of transistors 1 and 2, respectively, to $+V_{CC}$ and $-V_{CC}$ and sense the emitter currents flowing through transistors 1 and 2, respectively It can be readily seen that if the current flowing through resistor 5, transistor 3, transistor 4, and resistor 6 is relatively constant, a sudden increase in power dissipation in the area of transistors 1 and 2 causes the $V_{BE}$ voltages of transistors 1 and 2 to decrease, causing an increase in the current through transistors 1 and 2. This further increases their temperature and tends to cause thermal runaway unless corresponding corrections are made in a bias voltage applied between the bases of transistors 1 and 2. The conductors 9 and 10 conduct voltage increases across resistors 7 and 8 due to such decreases in the $V_{BE}$ voltages of transistors 1 and 2, producing a feedback signal between the inputs of operational amplifier 13. The output of operational amplifier 13 generates a correction voltage that is applied between the bases of transistors 3 and 4 to compensate for the decrease in $V_{BE}$ voltages of transistors 1 and 2. In this circuit, bias compensation capacitor 15 needs to be at least about 0.01 microfarads in order to prevent a variety of problems, such as modulation of quiescent supply current, drift of input offset voltage, variations of internal bias voltages and currents which may affect AC parameters such as bandwidth and settling time, and therefore cannot be included in a single integrated circuit chip with the rest of the wideband amplifier.

Referring now to FIG. 2, monolithic integrated circuit wideband amplifier 20 includes amplifier stage 21, which includes conventional circuitry very similar to the amplifier stage in the prior art circuit of FIG. 1. Wideband amplifier 20 also includes the feedback bias circuit 22 of the present invention. The amplifier stage 21 includes PNP transistor 70 having its emitter coupled by a 1.2 kilohm resistor 95 to $+V_S$ and its collector connected to the emitter of PNP transistor 71. The collector of transistor 70 also is connected to the base of NPN transistor 3. Transistor 71 has its collector connected to $-V_S$ and its base coupled to $+V_{in}$.

NPN transistor 76 has its emitter coupled to $-V_S$ by a 1.2 kilohm resistor 97 and its collector connected to the emitter of NPN transistor 77. The collector of transistor 76 is also connected to the base of PNP transistor 4. The collector of transistor 77 is connected to $+V_S$ and its base is coupled to $+V_{in}$. The emitters of transistors 3 and 4 are connected to $-V_{in}$.

The collector of transistor 3 is connected by 1.2 kilohm resistor 30 to $+V_S$ and to the base of PNP transistor 1. Similarly, the collector of transistor 4 is connected by 1.2 kilohm resistor 31 to $-V_S$ and to the base of NPN transistor 2.

The collector of transistor 1 is connected to the base of NPN transistor 28 and to the collector and base of diode-connected NPN transistor 24, the emitter of which is connected to one terminal of 16.25 ohm resistor 26, the other terminal of which is the emitter of diode-connected PNP transistor 25. The base and collector of transistor 25 are connected to the base of PNP output driver transistor 29 and to the collector of transistor 2. The collector of NPN output driver transistor 28 is connected to $+V_S$ and its emitter is connected by a 3.25 ohm resistor 83 to $V_{OUT}$. The collector of transistor 29 is connected to $-V_S$, and its emitter is connected by a 3.25 ohm resistor 84 to $V_{OUT}$.

In accordance with the present invention, the emitter currents in transistors 1 and 2 are not sensed by resistors such as 7 and 8 of FIG. 1. Instead, the emitter current of transistor 1 flows through a PNP current mirror circuit including transistors 32 and 33. The emitter area of transistor 32 can be 20 times that of transistor 33, although the exact ratio is not critical. The collector and base of transistor 32 are connected to the emitter of transistor 1. The emitters of transistors 32 and 33 are connected to $+V_S$. The collector of transistor 33 is connected by conductor 34 to the emitter of PNP transistor 35, which is part of the bias feedback circuit. Thus, the current flowing through conductor 34 is 1/20 of the emitter current of transistor 1.

Similarly, an NPN current mirror circuit including NPN transistors 41 and 42 mirrors a scaled down (i.e. by a factor of 20) value of the emitter current of transistor 2 to the bias feedback circuit. The collector and base of NPN transistor 41 are connected to the emitter of transistor 2 and to the base of NPN transistor 42. The emitters of transistors 41 and 42 are connected to $-V_S$. The collector of transistor 42 is connected by conductor 39 to the feedback bias circuit, which includes transistors 35, 37, 38, 40, 43, 45, 47, and compensation capacitor 65.

The base of transistor 35 is connected by conductor 85 to the collector and base of PNP transistor 80 and to the gate and source of JFET 81. (Note that all of the JFETs described herein are P channel JFETS.) Transistor 80 has its emitter connected to the collector and base of PNP transistor 79, the emitter of which is connected to conductor 50. The drain of JFET is connected to the collector and base of NPN transistor 57, the emitter of which is connected in series with diode-connected transistors 58, 59, and 60.

The emitter of transistor 48 is connected to the collector of PNP transistor 53 and to the base of PNP transistor 54. The collector of transistor 48 is connected to the source of JFET 47 and the collector of NPN transistor 49. The emitter of transistor 55 is connected to the base of transistor 53 and to the collector of transistor 54. The emitter of transistor 54 is connected to conductor 50. The emitter of transistor 53 is connected by a 8.87 kilohm resistor 91 to conductor 50. The emitter of transistor 49 is connected by 84.95 kilohm resistor 52 to conductor 50, which is connected to the emitter of diode-connected NPN transistor 66. The collector and base of transistor 66 are connected to $+V_S$. The base electrodes of transistors 48, 49 and 55 are connected by conductor 63 to the gate of JFET 56. The source of JFET 56 is connected by a 1.5 kilohm resistor 82 to conductor 63. The drain of JFET 56 is connected to $-V_S$.

The drain of JFET 47 is connected by conductor 46 to one terminal of 350 picofarad compensation capacitor 65, the other terminal of which is connected to $-V_S$. Conductor 46 also is connected to the gate electrode of JFET 64, the source of which is connected to the drain of JFET 69 and the base of NPN transistor 72.

The collector of transistor 35 is connected by conductor 36 to the collector and base of NPN transistor 37 and to the base of NPN transistor 38, the emitters of which are connected by 0.3 kilohm resistors to $-V_S$. The areas of transistors 37 and 38 and the values of resistors 92 and 93 can be equal, in which case the current flowing through conductor 36 and transistor 37 is mirrored unchanged through the collector of transistor 38, and is summed at the connection of conductor 39 to the collector of transistor 38 with current flowing through conductor 39 and the collector of NPN transistor 42. Conductor 39 is connected to the emitters of NPN transistors 40 and 43, the bases of which are connected to the base and collector of diode-connected NPN transistor 58. Diode-connected transistors 58, 59 and 60 maintain base of transistor 58 three $V_{BE}$ voltages above $-V_S$.

The collector of transistor 40 is connected to the emitter of NPN transistor 45, the collector of which is connected to the drain of JFET 47. The base of transistor 45 is connected to the base of NPN transistor 44, the collector of which is connected to $+V_S$ and the emitter of which is connected to the collector of NPN transistor 43. The base of transistor 45 also is connected to the base and collector of diode-connected NPN transistor 57.

The collector of NPN transistor 72 is connected to the gate electrode of JFET 69 and to the base of PNP transistor 70 and the collector and base of transistor 67. The source of JFET 69 is connected by a 2-kilohm resistor to the collector and base of diode-connected PNP transistor 67, the emitter of which is connected by a 0.6 kilohm resistor 94 to $+V_S$. The emitter of transistor 70 is connected by a 0.6 kilohm resistor 95 to $+V_S$.

Diode-connected NPN transistor 73 is connected in series between the emitter of transistor 72 and the collector and base of diode-connected NPN transistor 74, the emitter of which is connected to the base of NPN transistor 76 and to the collector and base of diode-connected NPN transistor 75 and to the drain of JFET 64. The emitter of transistor 75 is connected by a 0.6 kilohm resistor 96 to $-V_S$. The emitter of transistor 76 is connected by 0.6 kilohm resistor 97 to $-V_S$.

The feedback bias circuit 22 can be analyzed as a set of blocks. The first blocks include the current mirror transistors 32 and 33 and transistors 41 and 42. The PNP current mirror, including transistors 32 and 33, takes the emitter current of transistor 1 and replicates a scaled portion of it to conductor 34. Similarly, the NPN current mirror, transistors 41 and 42, takes the emitter current of transistor 2 and replicates a scaled portion of it to conductor 39. The scale factor for this circuit is 1/20 and is the same for both mirrors.

Transistor 66 simply provides a diode drop between $+V_S$ and the bandgap current source (transistors 54, 53, 55, 48, 49, JFET 47, JFET 56 and resistors 82, 52 and 91) and the diode bias string (transistors 79, 80, JFET 81, transistors 57, 58, 59 and 60). This is done to allow sufficient "headroom" between the emitter of transistor 35 and the collector of transistor 33 so that the latter device does not saturate on initial turn-on.

The transistors 79, 80, JFET 81, transistors 57, 58, 59 and 60 provide bias for other elements of the bias circuit 22. JFET 81 is connected with its gate tied to its source, thereby becoming a self-biased current source for the other diode connected transistors in this string.

The bandgap current source is composed of transistors 54, 53, 55, 48, 49, JFET 47, JFET 56 and resistors 82, 52 and 91. The transistors 54, 53, 55, 48 and resistor 91 provide a current that increases with temperature while transistor 49 and resistor 52 provide a current that decreases with temperature. These two currents are summed into the source of JFET 47. The drain of JFET 47 provides a current with zero or near zero temperature coefficient while at the same time providing a very high output impedance. JFET 56 is connected with resistor 82 in its source and the other end of resistor 82 connected to its gate to provide a low value self-biased current source for the start-up of the bandgap current source.

Transistor 35 is in series with transistor 33 to provide comparable base-collector bias across transistor 33 as appears across transistor 42. This also acts as a cascode to prevent variation of the current supplied to transistor 37 as supply voltages change; this effect is due to the Early effect known to those skilled in the art. Transistors 37 and 38 and resistors 92 and 93 form another current mirror to translate the current from transistor 35 and, hence, transistor 33 to the same polarity as that from transistor 42. These currents are summed together at the emitter connections of transistor 40 and transistor 43.

The transistors 40 and 43 share a common $V_{BE}$ and therefore will be scaled. In this case, the emitter area of transistor 43 is 19 times larger than the emitter of transistor 40 and will therefore pass 19 times the current of the emitter of transistor 40. In essence, the sum of the current at connection 39 is divided by 20 as it passes out the collector of transistor 40. Transistor 45 acts as a cascode to increase the output impedance to conductor 46, to which the bandgap current source is also attached. Transistor 44 constrains the collector-base voltage of transistor 43 to be the same as that of transistor 40, thereby minimizing errors induced by the Early effect.

JFET 64, JFET 69, transistors 72, 73 and 74 and resistor 68 form a voltage controlled current source. JFET 69 with resistor 68 connected to its source and the other end of resistor 68 connected to its gate form a moderate valued self-biased current source. It serves to provide bias current for JFET 64 and base current for transistor 72. JFET 64 acts as a source follower to drive the base of transistor 72. As the gate more current. Transistors 73 and 74 act as level-shift devices to keep the gate voltage of JFET 64 high enough to prevent transistor 45 from saturating.

The current from the voltage controlled current source (JFET 64, JFET 69, transistors 72, 73 and 74 and resistor 68) flows into current mirrors 67,70 and resistors 94 and 95 at the positive supply rail and transistors 75 and 76 and resistors 96 and 97 at the negative supply rail. These current mirrors feed into the wideband amplifier 21. Although not done in this circuit, the mirrors can be scaled. For example, one might want to reduce the current drawn by the voltage controlled current source.

In operation, the bias feedback circuit functions as follows. The emitter current of gain transistor 1 flows through transistor 32, and is mirrored through transistor 33 to produce a mirrored current in conductor 34 that is scaled down by a factor of 20 from the emitter current of transistor 1. This scaled down current flows through transistor 35 and conductor 36 into NPN current mirror transistor 37. That current is mirrored by a factor of 1 to produce a current of the same magnitude flowing through the collector and emitter of transistor 38 into $-V_S$. In effect, the "direction" of the current flowing in the collector of transistor 33 has been "reversed" so it is now being "sunk" into $-V_S$, rather than "sourced" from $+V_S$. It then is "summed" at conductor 39 with the scaled down, mirrored current flowing through conductor 39 through the collector of current mirror transistor 42, which also is "sunk" into $-V_S$. The collector current of transistor 42 is obtained from the emitter current of transistor 2 in a similar manner.

The sum of the two scaled down, mirrored currents of transistors 1 and 2 therefore are split so that 19/20 of it flows through transistor 43 and 1/20 of it flows through transistor 40. Thus, 1/400th of the sum of the currents flowing in the emitters of transistors 1 and 2 flows through transistor 45. (The 1/400th ratio is not critical, as long as the impedance at conductor 45 is very high loading into the drain of JFET 47 and the collector of transistor 45.) With this very small current flowing through its collector, the collector impedance of transistor 45 is very high.

In operation, the current mirror including transistors 32 and 33 senses any increases in current through transistor 1 due to a local temperature increase and the resulting reduction in the $V_{BE}$ "threshold", and scales that current increase down by a factor of 20. Similarly, the current mirror including transistor 41 and 42 senses and scales down current increases in transistor 2 by a factor of 20. The total current increase flowing through transistors 1 and 2, already scaled down by a factor of 20, is further divided by 20, as 1/20 of it flows through transistors 40 and 45. The current through the collector of transistor 45 is then compared with a reference current produced by the band gap reference current source and a corresponding adjustment is made to the bias voltage applied between the base of transistors 3 and 4 so as to cause the current flowing through the collector of transistor 45 to match the reference amount through JFET 47.

As mentioned earlier, the output impedances of the collector of transistor 45 and the drain of JFET 47 are very high. The impedance looking into the gate of JFET 64 is very high also. Since all three elements are connected to node 46, the impedance seen at this node is very high. This would then be the ideal point to connect a capacitor to roll off the frequency response of the feedback circuit. The 350 picofarads capacitor, Cc, is connected from this node to the negative supply voltage, $-V_S$. This connection, in addition to rolling off the circuit response to roughly 9.7 Hertz, allows for increased power supply rejection since any fluctuation in the minus supply will be passed through to node 46. This capacitance can be readily integrated onto the same integrated circuit chip as the rest of the wideband amplifier.

Consequently, the very low frequency pole of approximately 10 Hertz is provided for the feedback circuit so the operation of the bias feedback circuit does not produce any significant interference with the high frequency performance of the wide band amplifier section 21.

The feedback-caused adjustment of the bias voltage applied between the bases of transistors 3 and 4 perhaps can be understood best by assuming that the current through JFET 47 is greater than that through transistor 45. The excess current flowing into conductor 46 then raises the voltage of conductor 46. Source follower JFET 64 raises the voltage on the base of transistor 72, increasing the current through transistor 72 and consequently also increasing the current through transistors 70 and 76. This increases the bias voltage applied between the base electrodes of transistors 3 and 4, increasing the currents flowing through transistors 1 and 2. The increased currents through transistors 1 and 2 ar mirrored back through conductors 34 and 39 and are summed, as previously explained. Consequently, the current through the collector of transistor 45 increases until it matches the drain current of JFET 47. It should be noted that other bias circuits than the ones shown can be used. For example, the assignee is developing one with a zero input offset voltage.

In the monolithic integrated circuit implementation of the circuit of FIG. 2, 350 picofarad capacitance $C_c$ occupies an area of only approximately 28.5 mils by 28.5 mils. In contrast, a 0.01 microfarad capacitor required by the prior art would require a 152.5 mil by 152.5 mil area, if implemented on the same monolithic chip.

The above invention provides a relatively simple bias feedback control circuit for the wideband amplifier circuit without the need for an external compensation capacitor, while avoiding the above mentioned effect of interaction between the bias feedback circuit operation on the characteristics of the wideband amplifier.

It should be noted that the term "output stage" as used herein is intended to encompass both gain circuitry (such as that including transistors 1 and 2) and/or output buffer circuitry (such as that including transistors 28 and 29), so that the output stage is disposed between the outputs of a prior circuit stage (such as one including transistors 3 and 4) and an output terminal, such as $V_{OUT}$ terminal 99.

While the invention has been described with reference to a particular embodiment thereof, those skilled in the art will be able to make various modifications to the described embodiment without departing from the true spirit and scope of the invention.

What is claimed is:

1. A method of controlling corrections by a bias circuit to an input stage of a wideband amplifier, comprising the steps of:
   (a) sensing an emitter current of a first transistor in an output stage of the wideband amplifier and producing a first current that is smaller by a first factor than the emitter current;
   (b) splitting the first current into a second current and a third current which is smaller by a second factor than the first current, and conducting the third current out of a second transistor having its collector coupled by a first conductor to a gate electrode of a first field effect transistor, the first field effect transistor being a control transistor of the bias circuit;
   (c) supplying a fourth current to the first conductor by means of a constant current source circuit, the bias circuit adjusting a voltage on a base electrode of the first transistor to cause the third current to be equal to the fourth current.

2. The method of claim 1 wherein step (a) includes sensing the emitter current and producing the first current by means of a first current mirror circuit.

3. The method of claim 2 including compensating the bias circut's response to the third current by coupling a capacitor to the first conductor, the wideband amplifier, the bias circuit, the first field effect transistor, the first current mirror circuit, and the capacitor all being included on a monolithic integrated circuit chip.

4. The method of claim 3 wherein step (a) includes sensing an emitter current of a third transistor in the output stage and producing a fifth current that is smaller by the first factor than the emitter current of the third transistor, summing the fifth current and the first current, and wherein step (b) includes splitting the sum of the fifth and first currents.

5. In a wideband amplifier including an input stage, an output stage, and a bias circuit, the improvement comprising in combination:
   (a) means for sensing an emitter current of a first transistor of the output stage and producing in response thereto a first current that is smaller by a first factor than the emitter current of the first transistor;
   (b) means for splitting a current having the magnitude of the first current into a second current and a third current which is smaller by a second factor than the first current;
   (c) means for conducting the third current out of a second transistor having its collector coupled by a first conductor to a gate electrode of a first field effect transistor, the first field effect transistor being a control transistor of the bias circuit;

(d) means for supplying a fourth current to the first conductor by means of a constant current source circuit, the bias circuit adjusting a voltage on a base electrode of the first transistor to cause the third current to be equal to the fourth current.

6. The improvement of claim 5 wherein the sensing and first current producing means includes a first current mirror circuit coupled in series with the emitter of the first transistor and producing the first current.

7. The improvement of claim 6 including a compensation capacitor coupled to the first conductor.

8. The improvement of claim 7 including means for sensing an emitter current of a third transistor of the output stage and producing a fifth current that is smaller by the first factor than the emitter current of the third transistor and means for summing the fifth current and the first current, the first current splitting means splitting the sum of the fifth and first currents.

9. A method of controlling a DC bias current in an output stage of an amplifier by feedback from the output stage to an input stage, comprising the steps of:

(a) sensing an emitter current of a first transistor in the output stage by means of a first current mirror to produce a first mirrored current;

(b) conducting a feedback current which is a certain percentage of the first mirrored current through a second transistor;

(c) comparing a first feedback current to a reference current to produce an error signal; and (d) adjusting the DC bias voltage of the output stage in response to the error signal to cause the first feedback current to equal the reference current.

10. The method of claim 9 including compensating the error signal by means of a compensation capacitor, the amplifier and the compensation capacitor being on a single integrated circuit chip.

11. The method of claim 10 wherein step (a) includes scaling the first mirrored current to a first fraction of the emitter current, wherein the certain percentage is a scaled second fraction of the first mirrored current.

12. A method of controlling a DC bias current of an output stage of an amplifier with feedback from the gain stage to an input stage, comprising the steps of:

(a) sensing a first emitter current in a first transistor in the output stage by means of a first current mirror circuit to produce a first mirrored current, and sensing a second emitter current in a second transistor in the output stage by means of a second current mirror circuit to produce a second mirrored current;

(b) supplying a reference current from a very high impedance current source;

(c) summing the first and second mirrored currents;

(d) producing a feedback current which is a certain percentage of the sum of the first and second mirrored currents;

(e) causing the feedback current to flow into and out of a circuit stage having a very high output impedance;

(f) comparing the feedback current to the reference current; and (g) adjusting the DC bias current of the output stage in response to the comparing to cause the feedback current to equal the reference current.

13. The method of claim 12 wherein step (f) includes producing an error signal in response to the comparing and compensating the error signal by means of a compensation capacitor and step (g) includes applying a compensated error signal to an input transistor of a bias control circuit to adjust the DC bias current.

14. The method of claim 12 including applying the first mirrored current to a third current mirror circuit to reverse a direction of the first mirrored current before the summing of step (c).

15. The method of claim 14 including scaling down the first mirrored current by means of the third current mirror circuit before the summing of step (c).

16. In an amplifier, circuitry for controlling a DC bias current of an output stage of the amplifier by using feedback from the output stage to an input stage of the amplifier, this circuitry comprising in combination:

(a) means for sensing an emitter current of a first transistor in the output stage with a first current mirror circuit to produce a first mirrored current;

(b) means for producing a feedback current which is a certain percentage of the first mirrored current and causing the feedback current to flow through a second transistor;

(c) means coupled to the second transistor for comparing the feedback current to a reference current to generate an error signal; and (d) means for adjusting the DC bias current of the output stage in response to the error signal to cause the feedback current to equal the reference current.

17. The circuitry of claim 16 including a compensation capacitor connected to receive the error signal, the amplifier and the compensation capacitor being on a single integrated circuit chip.

18. The circuitry of claim 17 wherein the first mirrored current is a first fraction of the emitter current of the first transistor, and the certain percentage is a scaled down second fraction of the first mirrored current.

19. In an amplifier, circuitry for controlling a DC bias current of an output stage of an amplifier by using feedback from the output stage to an input stage, the circuitry comprising in combination:

(a) first sensing means for sensing a first emitter current in a first transistor in the output stage by means of a first current mirror circuit to produce a first mirrored current, and second sensing means for sensing a second emitter current in a second transistor in the output stage by means of a second current mirror circuit to produce a second mirrored current;

(b) a very high impedance current source supplying a reference current;

(c) means for summing at least a certain fraction of the first mirrored current with the second mirrored current;

(d) means for producing a feedback current which is a certain percentage of the sum of the first and second mirrored currents;

(e) a third transistor and means for causing the feedback current to flow through the third transistor, the third transistor having an electrode with a very high impedance;

(f) means coupled to the electrode for comparing the feedback current to the reference current to produce an error signal;

(g) mean for adjusting the DC bias current of the output stage in response to the error signal so as to cause the feedback current to equal the reference current.

20. The circuitry of claim 19 including a compensation capacitor and means for applying a compensated error signal to an input transistor of a bias control circuit to adjust the DC bias current.

21. The circuitry of claim 19 including a third current mirror circuit receiving the first mirrored current and coupled to the summing means to reverse a direction of the first mirrored current thereof before the summing.

22. The circuitry of claim 21 wherein the first transistor is a PNP transistor, the first current mirror circuit includes a PNP control transistor having a collector coupled to an emitter of the first transistor and a PNP output transistor, the second transistor is an NPN transistor, and the second current mirror circuit includes an NPN control transistor and an NPN output transistor, the summing means being coupled to a collector of the PNP output transistor and the collector of the NPN output transistor.

23. The circuitry of claim 22 wherein the third current mirror circuit includes an NPN control transistor having a collector coupled to the collector of the PNP output transistor and an NPN output transistor coupled to a collector of the NPN output transistor of the second current mirror circuit.

24. The circuitry of claim 23 wherein the feedback current producing means include first and second NPN transistors having a common base connection and emitters connected to the collector of the NPN output transistor of the third current mirror circuit, the third transistor being an NPN transistor, a collector of the second NPN transistor being coupled to an emitter of the third transistor, an emitter area of the second NPN transistor being a small fraction of an emitter area of the first NPN transistor.

25. The circuitry of claim 24 wherein the first mirrored current is a small fraction of the emitter current of the first transistor and the second mirror current is a small fraction of the emitter current of the second transistor.

* * * * *